United States Patent [19]

Wataze et al.

[11] 4,215,358
[45] Jul. 29, 1980

[54] MESA TYPE SEMICONDUCTOR DEVICE

[75] Inventors: Manabu Wataze; Kazuhisa Takahashi; Saburo Takamiya; Shigeru Mitsui, all of Amagasaki, Japan

[73] Assignee: Mitsubishi Denki Kabushiki Kaisha, Tokyo, Japan

[21] Appl. No.: 846,492

[22] Filed: Oct. 27, 1977

[30] Foreign Application Priority Data

Nov. 1, 1976 [JP] Japan ................................. 51/131396

[51] Int. Cl.² .............................................. H01L 29/06
[52] U.S. Cl. ......................................... 357/56; 357/13; 357/52
[58] Field of Search ...................... 357/56, 36, 13, 52

[56] References Cited

U.S. PATENT DOCUMENTS

| 3,746,587 | 7/1973 | Rosvold | 357/56 |
| 3,961,356 | 6/1976 | Kool | 357/56 |

*Primary Examiner*—Edward J. Wojciechowicz
*Attorney, Agent, or Firm*—Wenderoth, Lind & Ponack

[57] ABSTRACT

A P type semiconductor layer is epitaxially grown on an N+ type semiconductor substrate to form a PN junction between them so as to expose its circumference to the peripheral surface of the substrate. The P type layer is formed into a mesa having a tilted surface to which the circumference of the PN junction is exposed. Then an N+ type diffusion layer is disposed on the tilted mesa surface to protect the PN junction.

6 Claims, 9 Drawing Figures

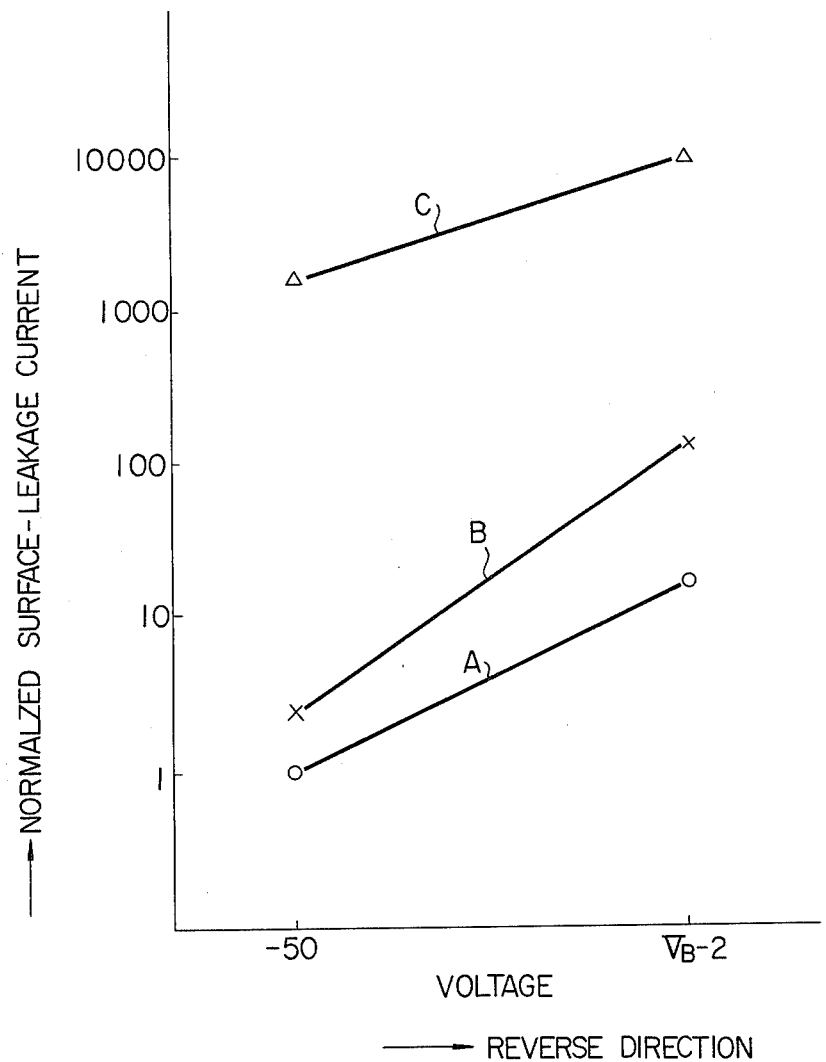

MESA TYPE SEMICONDUCTOR DEVICE

BACKGROUND OF THE INVENTION

This invention relates to a mesa type semiconductor device, and more particularly to such a semiconductor device having a high breakdown voltage and also having, by itself, means for stabilizing the tilted surface of the mesa portion involved.

In mesa type semiconductor devices of the conventional construction, the mesa portion has been applied with a surface stabilizing film formed of a silicon nitride ($Si_3N_4$), phosphosilicone glass, lead oxide (PbO), alumina ($Al_2O_3$) or the like or coated with any of silicone varnishes, silicone rubbers, resins such as polyamides, etc. because the PN junction applied with a reverse bias has its circumference exposed to the surface of the mesa portion and therefore a leakage current must be prevented from flowing across the exposed portion of the PN junction.

The surface stabilizing film is advantageous in that it can be attached to one of the main opposing surfaces of semiconductor wafers before the wafers are divided into individual chips. However, upon forming windows on selected portions of the surface stabilizing film in a later step according to the selective etching technique, those portions of the film located at the edges of the mesa portions are decreased in thickness. As a result, the surface stabilization is not satisfactorily accomplished. This is because the mask or the photoresist used upon the formation of the windows as described above is not satisfactorily applied to those portions of the surface stabilizing film at and adjacent to the edges of the abovementioned mesa.

With the varnishes or resins used, the electric characteristics of the semiconductor elements are confirmed only after the associated semiconductor chips have been subjected to die bonding and still the sintering of the resins consumes a long time. This has resulted in a decrease in work efficiency.

Accordingly, it is an object of the present invention to provide a new and improved mesa type semiconductor device able to withstand high breakdown voltages.

It is another object of the present invention to provide a new and improved mesa type semiconductor device having a reduced surface leakage current and including a much stabilized surface of the mesa portion.

It is still another object of the present invention to provide a new and improved mesa type semiconductor device manufactured with excellent work productivity.

SUMMARY OF THE INVENTION

The present invention provides an mesa type semiconductor device comprising a first semiconductor layer of one type of conductivity, a second semiconductor layer of the other type of conductivity disposed on the first semiconductor layer to form a PN junction therebetween, a mesa portion formed so as to have the circumference of the PN junction exposed thereto, and a third semiconductor layer disposed on the mesa portion and identical in conductivity type to the first semiconductor layer.

BRIEF DESCRIPTION OF THE DRAWINGS

The present invention will become more readily apparent from the following detailed description taken in conjunction with the accompanying drawings in which:

FIG. 5 is a graph illustrating the surface stabilization effect provided by the present invention in contradistinction with that provided by the prior art practice.

DESCRIPTION OF THE PREFERRED EMBODIMENT

Figure 1:
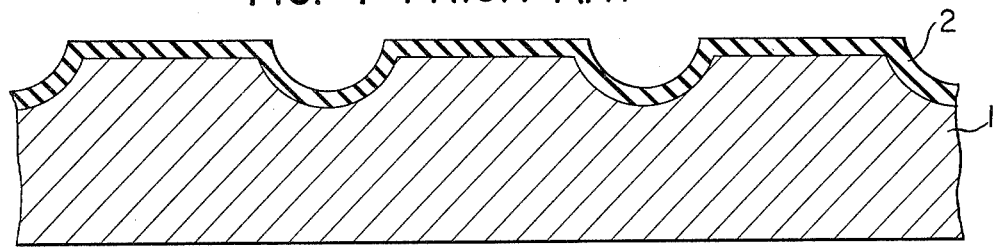
FIG. 1 is a fragmental cross sectional view of a semiconductor wafer with mesa portions illustrating na early step of the conventional process of manufacturing mesa type semiconductor devices.
Figure 2:
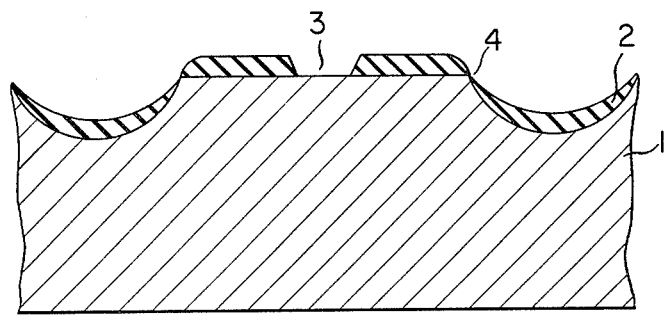
FIG. 2 is a view similar to FIG. 1 but illustrating a later step of the conventional manufacturing process.

In FIG. 1 of the drawings a semiconductor wafer 1 is shown as being provided on one of the main opposite faces thereof with grooves arranged in a predetermined pattern to form mesa portions encircled thereby and including a surface stabilization layer 2 disposed on the main face thereof over the entire area. As seen from FIG. 1, the surface stabilization film 2 is advantageous in that it can be readily disposed on the wafer 1 before it is divided into semiconductor chips. However, in the later step of forming a window, such as shown by the reference numeral 3 in FIG. 2, on a selected portion of the surface stabilization film 2, in this case, on the flat top surface of the mesa portion by selective etching technique, the film might thin at and adjacent to an edge 4 of the mesa portion enough to make the surface stabilization impossible. The reason for this was that the mask or the photoresist used upon forming the window 3 was not sufficiently coated on the mesa edge 4.

Figure 3:
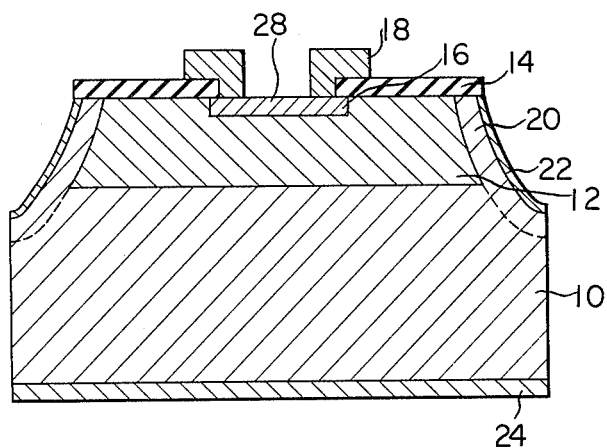
FIG. 3 is a cross sectional view of a mesa type semiconductor device constructed in accordance with the principles of the present invention.

Referring now to FIG. 3, there is illustrated a mesa type semiconductor device constructed in accordance with the principles of the present invention. The arrangement illustrated is particularly suitable for use as an avalanche photodiode and comprises a semiconductor substrate 10 assumed to be of an N+ type conductivity, a P type semiconductor layer 12 disposed on the N+ type substrate 10 by an epitaxial growth technique to form a PN junction therebetween, and an electrically insulating layer 14 disposed on the top surface of the P type semiconductor layer 12. The electrically insulating layer 14 is formed of any suitable oxide film and provided with a window at its central portion. Then a P+ type contact layer 16 is disposed on that portion of the P type semiconductor layer 12 exposed to the window by diffusing a P type impurity into the P type layer 12 through the window, and an annular metallic electrode 18 is disposed in ohmic contact with the contact layer 16 and includes an outer peripheral portion laid over the insulating layer 14. The electrode 18 is preferably formed of an aluminum evaporated film.

As shown in FIG. 3, the P type semiconductor layer 12 includes a peripheral portion in the form of a mesa formed by a mesa etching process with the mesa extending in the adjacent portion of the substrate 10. Then a stratiform N+ type diffusion region 20 is disposed on the peripheral portion of the mesa and a P+ type diffusion layer 22 is disposed on the diffusion region 20. Thus the diffusion region 20 has the same conductivity type as the substrate 10. The P+type diffusion layer 22 is formed simultaneously with the formation of the contact layer 16.

The substrate 10 also includes a metallic electrode 24 disposed on the lower or other main face thereof. The electrode 24 may be a titanium and gold evaporated film, a nickel and gold plated film or the like.

Figure 4A:
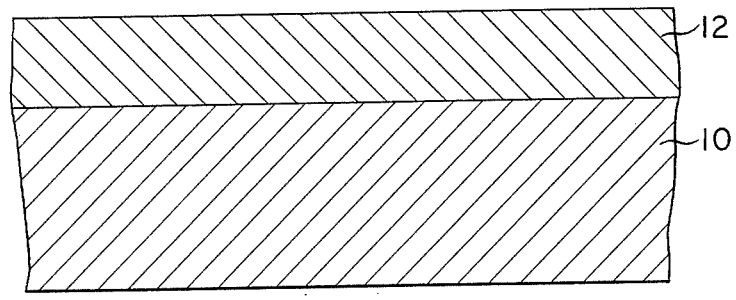
FIGS. 4a through 4e are fragmental cross sectional views of a semiconductor wafer illustrating in the successive manufacturing steps of a process of manufacturing mesa type semiconductor devices in accordance with the principles of the present invention in the order thereof.

As an example, the process of manufacturing a mesa type semiconductor device such as shown in FIG. 3 will now be described in conjunction with FIGS. 4a through 4j wherein like reference numerals designate components identical to those shown in FIG. 3. First an N+ type semiconductor substrate 10 having a thickness of about 200 microns is prepared and a P type semiconductor layer 12 is disposed on one of the main faces, in this case, the upper main face of the substrate 10 using, for example, an epitaxial growth technique to form a PN junction therebetween. The substrate 10 has an inpurity concentration of $1 \times 10^{19}$ atoms per cubic centimeter while the epitaxial layer 12 has a thickness of about 10 microns and an impurity concentration ranging from $3 \times 10^{15}$ to $4 \times 10^{15}$ atoms per cubic centimeter. The resulting structure is shown in FIG. 4a.

Figure 4B:
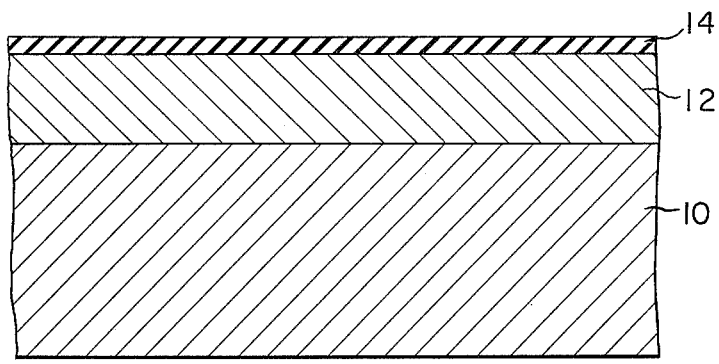

Then the surface of the P type semiconductor layer 12 is thermally treated in an oxidizing atmosphere. This results in the formation of an electrically insulating layer 14 on the P type semiconductor layer 12 as shown in FIG. 4b. The electrically insulating layer 14 is composed of a silicon oxide film having a thickness of 5000 Å. Alternatively, a chemical vapor deposition process may be used to dispose an electrically insulating layer 14 on the P type semiconductor layer 12.

In order to prepare the substrate for its division into chips, the electrically insulating layer 14 is selectively etched away in a predetermined pattern according to the photolithographic and etching techniques well known in the art. The removed portion of the insulating layer 14 is preferably somewhat greater in width than the zones along which the substrate is divided into chips in the later step and may be 50 microns wide.

Figure 4C:
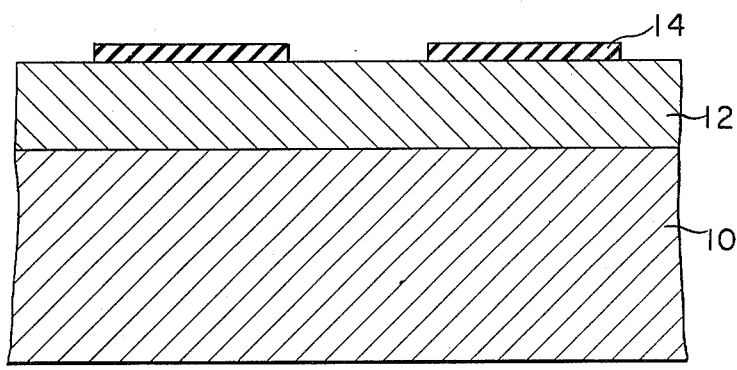
Figure 4D:
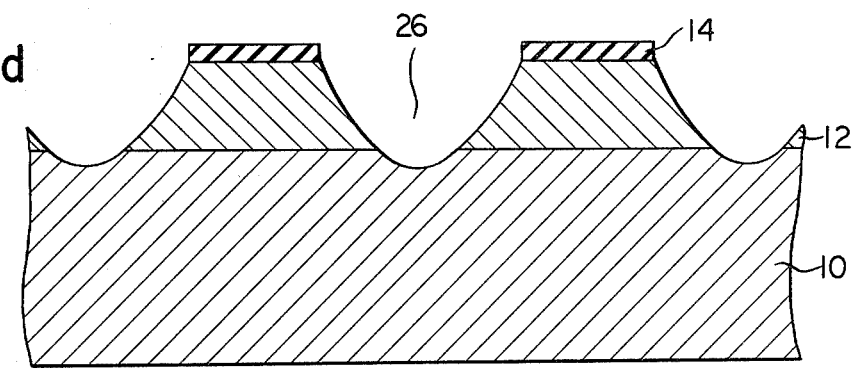

Then the structure as shown in FIG. 4c is chemically etched with the remaining portions of the insulating layer 14 acting as masks. This etching results in the formation of recesses 26 in the form of V's having round valleys extending into the N+ type semiconductor substrate 10 as shown in FIG. 4d.

Following this, any suitable N type impurity is diffused into the surfaces of the recesses 26 to form diffusion layers 20 thereon. The diffusion layer 20 has the same conductivity type as the N+ type substrate 10. For example, phosphorus could be deposited on the surface of each recess 26 at 950° C. for thirty minutes and then the phosphorus deposited P type layer 12 with the N+ substrate 10 maintained at 1100° C. for one hour to provide the diffusion layers 20 of about 2 microns on the surfaces of the recesses 26.

Figure 4E:
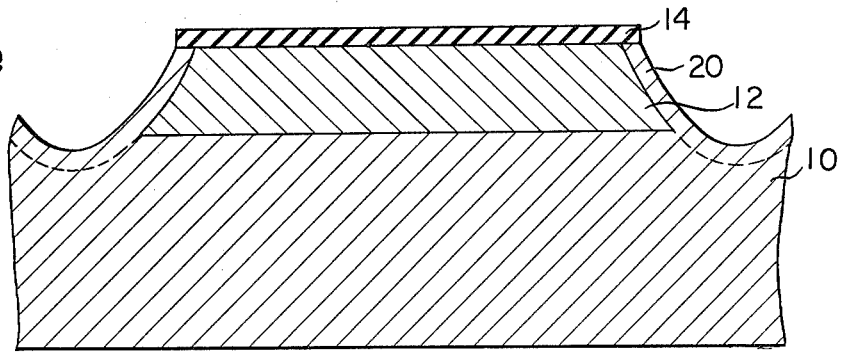

The resulting structure is shown in FIG. 4e.

Thereafter the well known selective etching technique is utilized to form a window on each of the insulating layer 14 portions and any suitable P type impurity is diffused into those portions of the P type semiconductor layer 12 exposed to the windows through the latter to form P+ type contact layers 16. At the same time, P+ type diffusion layers 22 are disposed on the diffusion layers 20 (see FIG. 3). However, the diffusion layer 22 may be omitted, if desired.

Then annular electrodes 18 are disposed in ohmic contact with the contact layers 16 and the insulating layer portions 14 respectively as above described in conjunction with FIG. 3 by using, for example, the aluminum evaporation technique. Also an electrode 24 is similarly disposed in ohmic contact with the other or lower main face of the substrate 10. The electrode 18 has a thickness of 1.5 microns when it is formed of an aluminum evaporated film. Also the electrode 24 formed of a nickel and gold plated film may have a thickness of 1 micron of nickel and a thickness of 2 microns of gold. When composed of a titanium and gold evaporated film, the electrode 24 may have a thickness of 500 Å of titanium and a thikcness of 2 microns of gold.

The substrate thus processed is divided along the valleys of the V-shaped recesses 26 by a scriber into semiconductor chips.

In FIG. 3 the reference numeral 28 designates a light receiving surface provided on the contact layer 16 inside the annular electrode 18 because FIG. 3 illustrates an avalanche photodiode.

It has been found that the diffusion layer 20 is effective for stabilizing the surfaces of the N+ type semiconductor substrate 10 and the P type semiconductor layer 12 and that, as the layer 20 has a uniform depth of diffusion over the entire area, it prevents the deterioration of the surface stabilization resulting from the decrease in thickness of conventional surface stabilizing films occurring on the mesa's edge portion upon their formation. Further the diffusion layers 20 are disposed on the recesses on the substrate 10 before the latter is divided into semiconductor chips resulting in excellent work productivity.

FIG. 5 illustrates the surface stability of an avalanche photodiode constructed as above described as compared with conventional ones. In FIG. 5 the ordinate represents the normalized surface leakage-current on a logarithmic scale an the abscissa represents the voltage applied in the reverse direction across the avalanche photodiode. The straight line labelled A depicts the characteristics of a device constructed according to the present invention. The straight line B illustrates the characteristics of a conventional avalanche photodiode processed with a silicone varnish. The straight line C illustrates the charactertistics of another type of avalance photodiode including a surface stabilization film having broken portions to which the edge of the mesa is exposed. These straight lines extend between two values of the surface leakage-current measured and normalized at a reverse voltage of $-50$ volts and at a voltage 2 volts less than the breakdown voltage.

From FIG. 5 is is seen that the present invention exhibits an excellent surface stabilization effect.

From the foregoing it is apparent that the present invention provides a mesa type semiconductor device having a well stabilized surface and capable of high productivity manufacture.

While the present invention has been illustrated and described in conjunction with a single preferred embodiment it is to be understood that numerous changes and modifications may be resorted to without departing from the spirit and scope of the present invention. For example, while the present invention has been described in conjunction with an avalanche photodiode, it is to be understood that it is equally applicable to a wide variety of semiconductor devices such as semiconductor diodes, transistors etc.

What we claim is:

1. A mesa type semiconductor device comprising:

a first semiconductor layer of one type conductivity having a mesa portion;

a second semiconductor layer of the opposite type conductivity disposed on said mesa portion of said first semiconductor layer having a top surface opposite said mesa portion of said first semiconductor layer and forming a first PN junction with said first semiconductor layer, said first PN junction having a circumferential portion disposed at the circumference of said mesa portion of said first semiconductor layer; and a third semiconductor layer having the same type conductivity as said first semiconductor layer covering the edges of said first and second semiconductor layers at said circumferential portion of said first PN junction forming a second PN junction with said second semiconductor layer extending to said top surface of said second semiconductor layer.

2. A mesa type semiconductor device as claimed in claim 7 wherein said third semiconductor layer is a diffisuion layer disposed in said first and second semiconductor layers.

3. A mesa type semiconductor device as claimed in claim 7 wherein said second semiconductor layer is an epitaxially grown layer disposed on said first and second semiconductor layers.

4. A mesa type semiconductor as claimed in claim 1 wherein said first PN junction is an avalanche PN junction.

5. A mesa type semiconductor device as claimed in claim 1 wherein said second PN junction includes an end exposed to said top surface of said second semiconductor layer and said device further comprises an electrically insulating film disposed on said second semiconductor layer covering said end of said second PN junction exposed to said top surface of said second semiconductor layer.

6. A mesa type semiconductor as claimed in claim 5, further comprising:

a fourth semiconductor layer having the same type conductivity as said second semiconductor layer disposed in ohmic contact with said second semiconductor layer; and an annular electrode disposed in ohmic contact with said fourth semiconductor layer.

* * * * *